(12) United States Patent
Kim (10) Patent No.: US 9,105,321 B1
(45) Date of Patent: Aug. 11, 2015

(54) MEMORY DEVICE AND DRIVING CIRCUIT ADOPTED BY THE MEMORY DEVICE

(71) Applicant: Winbond Electronics Corp., Taichung (TW)

(72) Inventor: Young Tae Kim, San Ramon, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/298,506

(22) Filed: Jun. 6, 2014

(51) Int. Cl.
| | |
|---|---|
| *G11C 7/10* | (2006.01) |
| *G11C 7/12* | (2006.01) |
| *H03K 19/0175* | (2006.01) |
| *G11C 7/22* | (2006.01) |
| *G11C 11/413* | (2006.01) |

(52) U.S. Cl.
CPC .......... *G11C 7/12* (2013.01); *H03K 19/017509* (2013.01); *G11C 7/22* (2013.01); *G11C 7/227* (2013.01); *G11C 11/413* (2013.01)

(58) Field of Classification Search
CPC .......... G11C 7/12; G11C 7/22; G11C 11/413; G11C 7/227; G11C 5/063
USPC .................... 365/189.17, 189.05, 189.08, 191
See application file for complete search history.

(56) References Cited

U.S. PATENT DOCUMENTS

| | | | | |
|---|---|---|---|---|
| 5,677,650 | A * | 10/1997 | Kwasniewski et al. | 331/57 |
| 5,731,724 | A * | 3/1998 | Grishakov et al. | 327/227 |
| 5,754,418 | A * | 5/1998 | Park et al. | 363/60 |
| 5,999,022 | A * | 12/1999 | Iwata et al. | 327/112 |
| 6,438,034 | B1 * | 8/2002 | Tanzawa | 365/185.18 |
| 6,885,605 | B2 * | 4/2005 | Lee et al. | 365/226 |
| 7,193,427 | B2 * | 3/2007 | Persun et al. | 324/762.03 |
| 7,313,050 | B2 * | 12/2007 | Lee et al. | 365/230.06 |
| 7,956,655 | B1 * | 6/2011 | Chiu | 327/108 |
| 8,331,170 | B2 * | 12/2012 | Chu | 365/189.17 |
| 8,704,584 | B2 * | 4/2014 | Shimazaki et al. | 327/395 |

* cited by examiner

*Primary Examiner* — Viet Q Nguyen
(74) *Attorney, Agent, or Firm* — Muncy, Geissler, Olds & Lowe, P.C.

(57) ABSTRACT

A memory device and a driving circuit adopted by the memory device are disclosed. The driving circuit includes a power line, a ground line, and first and second data lines coupled between the power line and the ground line. Each data line comprises 4 driver groups. For the first data line, the first driver group contains an even-stage inverter driver, the second driver group contains the even-stage inverter driver, the third driver group contains an odd-stage inverter driver, and the fourth driver group contains the odd-stage inverter driver. For the second data line, the first driver group contains the odd-stage inverter driver, the second driver group contains the even-stage inverter driver, the third driver group contains the even-stage inverter driver, and the fourth driver group contains the odd-stage inverter driver. The even-stage inverter driver comprises an even number of inverters. The odd-stage inverter driver comprises an odd number of inverters.

12 Claims, 7 Drawing Sheets

MEMORY DEVICE AND DRIVING CIRCUIT ADOPTED BY THE MEMORY DEVICE

BACKGROUND OF THE INVENTION

1. Field of the Invention

The present invention relates to semiconductor circuits, and in particular relates to a memory device and a driving circuit adopted by the memory device.

2. Description of the Related Art

As semiconductor technology advances, transistors sizes of semiconductor circuits are shrunk and a power supply voltage supplied to a semiconductor circuit is decreased. In semiconductor memories, large amounts of memory data are read and written frequently and in high speed, resulting in an escalated scale of power noises in power signals. Noises in a power supply to a semiconductor memory circuit will lead to decreased signal-to-noise ratio (SNR) and increased bit error rate (BER), both cause damages to circuit performance.

Therefore, a memory device and a driving circuit adopted by the memory device for reducing power noise in the power supply are required.

BRIEF SUMMARY OF THE INVENTION

A detailed description is given in the following embodiments with reference to the accompanying drawings.

A driving circuit is disclosed, comprising a power line, a ground line, and first and second data lines. The first and second data lines are coupled between the power line and the ground line. Each data line comprises 4 driver groups. For the first data line, the first driver group contains an even-stage inverter driver, the second driver group contains the even-stage inverter driver, the third driver group contains an odd-stage inverter driver, and the fourth driver group contains the odd-stage inverter driver. For the second data line, the first driver group contains the odd-stage inverter driver, the second driver group contains the even-stage inverter driver, the third driver group contains the even-stage inverter driver, and the fourth driver group contains the odd-stage inverter driver. The even-stage inverter driver comprises an even number of inverters. The odd-stage inverter driver comprises an odd number of inverters.

Another embodiment of a memory device is provided, comprising a power line, a ground line, and a memory circuit. The memory circuit, coupled between the power line and the ground line, comprises a driving circuit and a memory cell array. The diving circuit comprises first and second data lines, coupled between the power line and the ground line, driving memory data to and from the memory cell array, each data line comprises 4 driver groups. For the first data line, the first driver group contains an even-stage inverter driver, the second driver group contains the even-stage inverter driver, the third driver group contains an odd-stage inverter driver, and the fourth driver group contains the odd-stage inverter driver. For the second data line, the first driver group contains the odd-stage inverter driver, the second driver group contains the even-stage inverter driver, the third driver group contains the even-stage inverter driver, and the fourth driver group contains the odd-stage inverter driver. The even-stage inverter driver comprises an even number of inverters. The odd-stage inverter driver comprises an odd number of inverters.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

As disclosed herein, memory devices may refer to Dynamic Random Access Memory (DRAM), Static DRAM (SDRAM), Electrically Erasable and Programmable ROM (EEPROM), NAND flash memory, NOR flash memory, Phase-change RAM (PRAM), Magnetic RAM (MRAM), and Ferroelectric RAM (FRAM), and resistive memory devices (ReRAMs).

Figure 1:
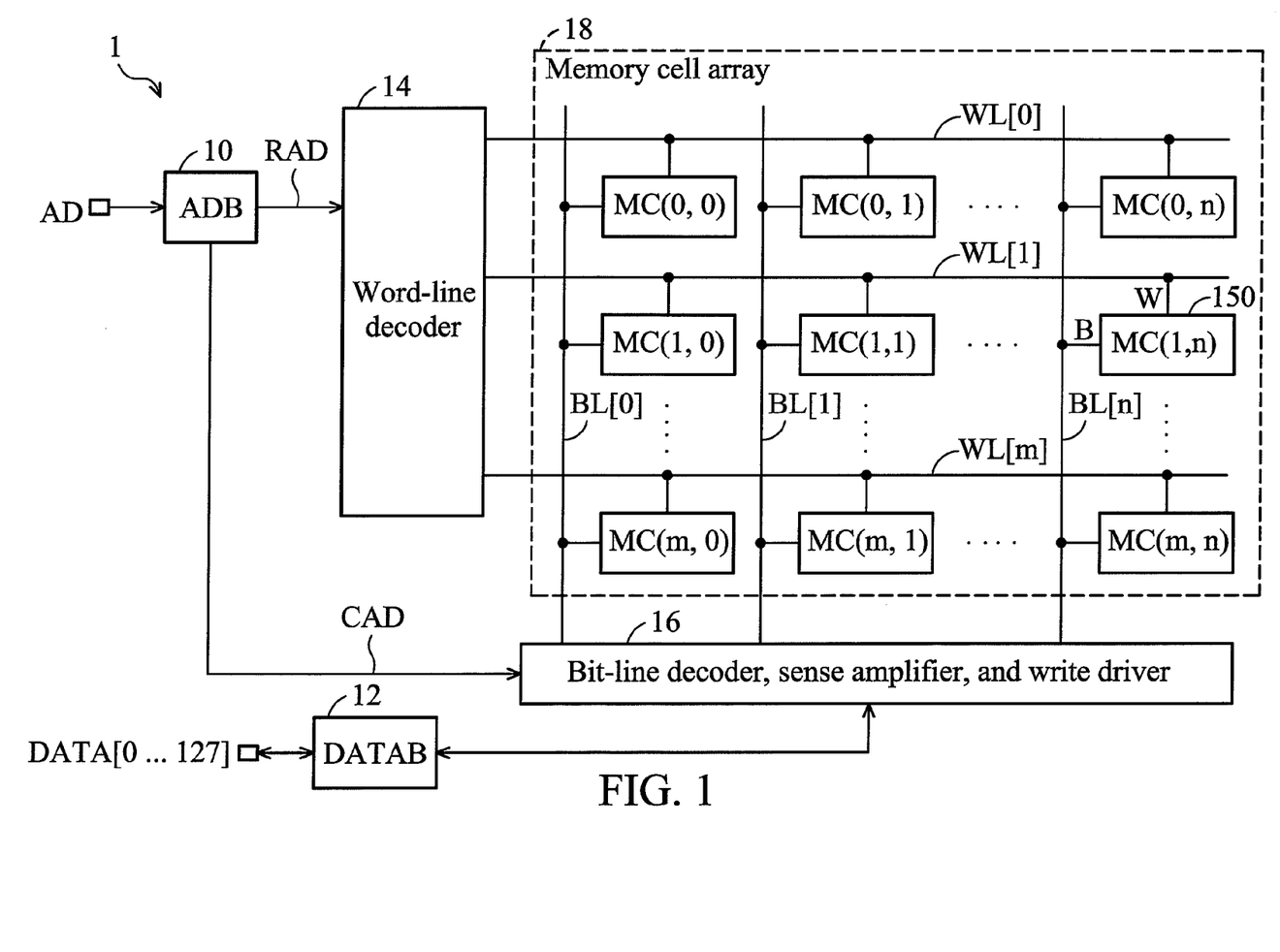
FIG. 1 is a block diagram of a memory device 1 according to an embodiment of the invention.

FIG. 1 is a block diagram of a memory device 1 according to an embodiment of the invention, comprising an address buffer (ADB) 10, a data buffer (DATAB) 12, a word-line decoder 14, a bit-line decoder, sense amplifier, and write driver 16, and a memory cell array 18. The memory device 1 is formed on a silicon substrate, for example, using a complementary metal oxide semiconductor (CMOS) process. The memory device 1 may be a semiconductor memory housed in a package, and may be a memory macro (an intellectual property core (IP)) that is embedded in a system large scale integrated circuit (system LSI) or the like. The memory device 1 may be a non-clock-synchronized-type semiconductor memory or a clock-synchronized-type semiconductor memory.

Figure 2:
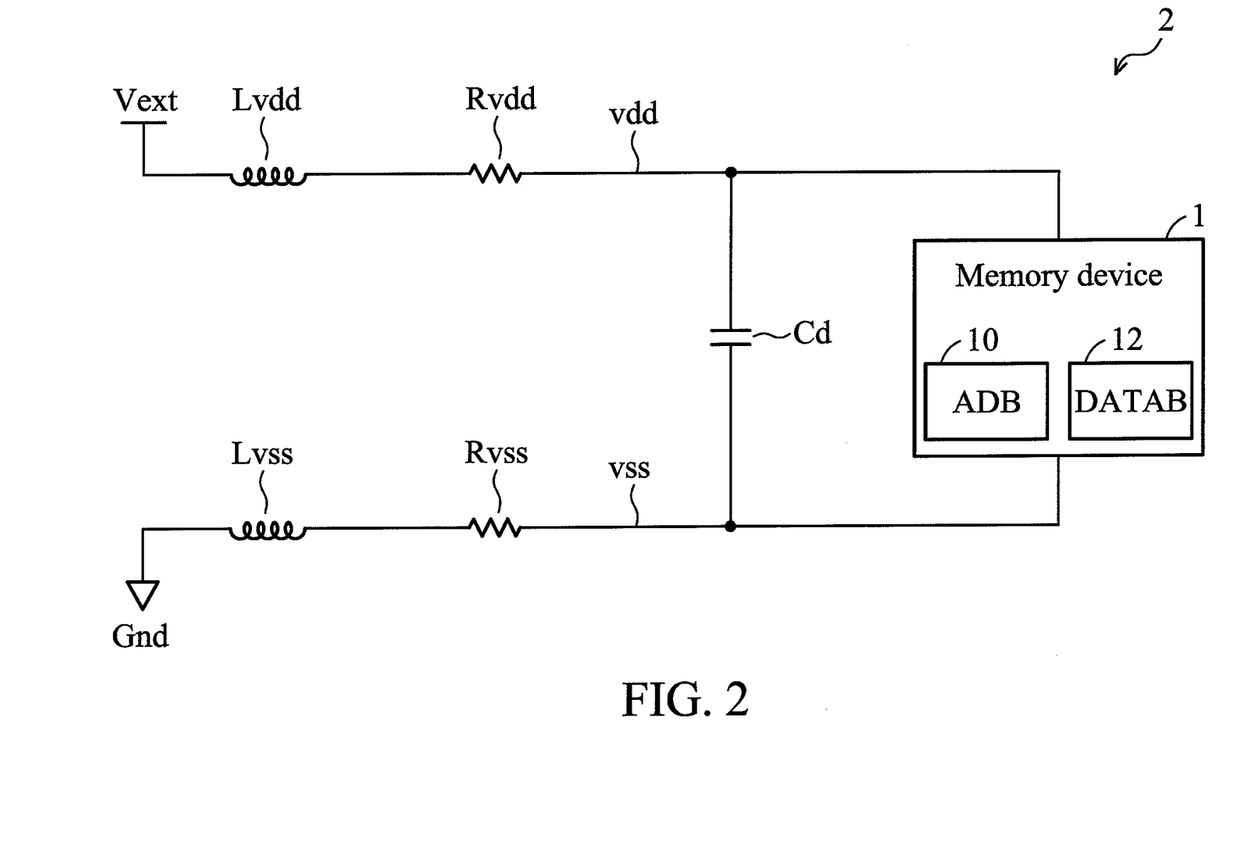
FIG. 2 is a schematic diagram of a power system 2 according to an embodiment of the invention.

In some embodiments, all circuits or all analog circuits of the memory device 1 are connected to a common external power source via common power and ground rails. For example, all circuits in the data buffer DATAB 12 and the address buffer ADB 10 are connected to a common power source Vext via a common power line vdd and ground line vss which can be modeled as inductors connected in series, as depicted in FIG. 2. As a consequence, when the circuits including active loads draw currents from the power source, the time varying currents create a power noise across the inductors.

Turning back to FIG. 1, the data buffer DATAB 12 drives data signals DATA[0 . . . 127] via a data bus and outputs the received data signals DATA[0 . . . 127] to and from the bit-line decoder, sense amplifier, and write driver 16, where the received data signals DATA[0 . . . 127] for reading and writing into a memory cell MC of the memory cell array 18. The address buffer ADB 10 receives address signals AD via an address bus, and outputs high order bits of the address signals AD, for example, a row address RAD to the word-line decoder 14 and high order bits of the address signals AD, for example, a column address CAD to the bit-line decoder, sense amplifier, and write driver 16. The word-line decoder 14 decodes the row address RAD and selects one of the word drivers to activate a corresponding word line WL from a low level, for example, a ground potential VSS, to a high level, for example, a power supply voltage VDD for a given period. The bit-line decoder, sense amplifier, and write driver 16 decodes the column address CAD and selects one of the write drivers to activate a corresponding bit line BL from a low level, for example, a ground potential VSS, to a high level, for example, a power supply voltage VDD for a given period.

Figure 3:
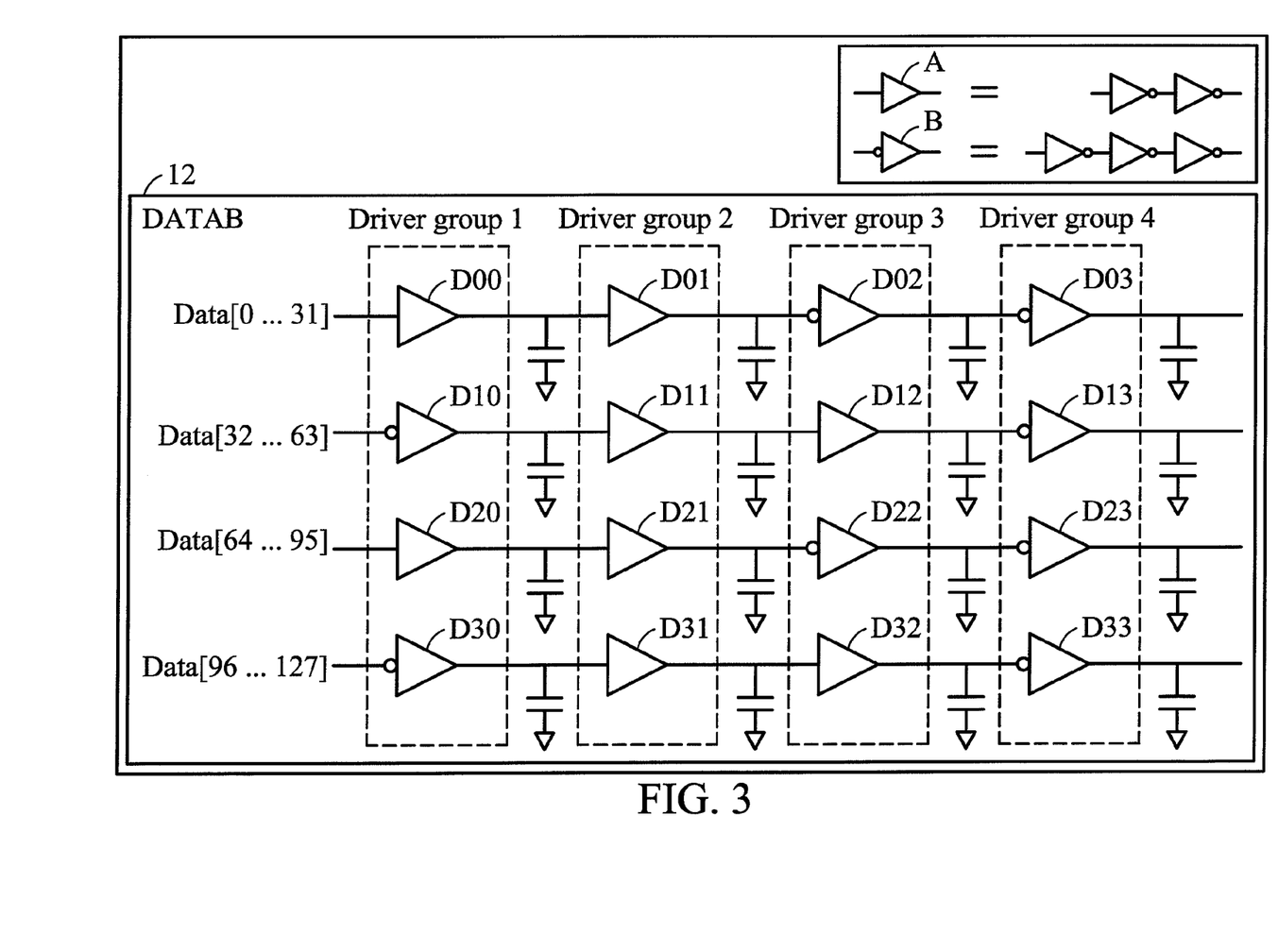
FIG. 3 is a schematic diagram of a data buffer circuit 12 according to an embodiment of the invention.

Accordingly, the data buffer DATAB 12 contains 128-bit data lines and the address buffer ADB 10 contains 32-bit data lines. In order to reduce the power noise induced on the power and ground lines vdd and vss by 50 percent, data buffer circuits containing two or multiples of two data lines can adopt a specific order of driver types as shown in FIG. 3. That is, each data line of the data buffer DATAB 12 and the address buffer ADB 10 includes 4 driver groups with the specific order of the driver types in FIG. 3. The 4 driver groups are a driver group 1, a driver group 2, a driver group 3, and a driver group 4. Take the data buffer DATAB 12 as an example, each data line contains 4 driver groups formed by even-stage inverter drivers A or odd-stage inverter drivers B, where the even-stage inverter drivers A contains an even-number of inverters and the odd-stage inverter drivers B contains an odd-number of inverters. For example, the even-stage inverter driver A is formed by 2 inverters, and the odd-stage inverter driver A is formed by 3 inverters. An inverter is not limited to an inverter logic gate, but can be any type of inverting logic gate. The 128-bit data are divided into 4 data groups, namely Data[0 . . . 31], Data[32 . . . 63], Data[64 . . . 95], and Data[96 . . . 127] respectively. Each data group are coupled between the power and ground lines vdd and vss (not shown), and transmits data signals DATA via the data bus from 4 places of a memory chip.

The data group Data[0 . . . 31] contains 32 data lines, each data line contains 4 drivers arranged in an order of an even-stage inverter driver D00, an even-stage inverter driver D01, an odd-stage inverter driver D02, and an odd-stage inverter driver D03. The data group Data[32 . . . 63] contains 32 data lines, each data line contains 4 drivers arranged in an order of an odd-stage inverter driver D10, an even-stage inverter driver D11, an even-stage inverter driver D12, and an odd-stage inverter driver D13. The data group Data[64 . . . 95] contains 32 data lines, each data line contains 4 drivers arranged in the same order as in the data group Data[0 . . . 31], including an even-stage inverter driver D20, an even-stage inverter driver D21, an odd-stage inverter driver D22, and an odd-stage inverter driver D23. The data group Data[96 . . . 127] contains 32 data lines, each data line contains 4 drivers arranged in the same order as in the data group Data[32 . . . 63], including an odd-stage inverter driver D30, an even-stage inverter driver D31, an even-stage inverter driver D32, and an odd-stage inverter driver D33.

With the circuit arrangement in FIG. 3, the data buffer DATAB 12 can deliver data Data[0 . . . 127] between the data bus and the memory cell array while reducing the power noise on the power and ground lines. FIGS. 4 through 7 illustrate four embodiments in which the data buffer DATAB 12 reduces the power noise by 50% during data delivery.

Referring to FIG. 3 and Table 1 below, Table 1 shows output transients of inverter drivers D00 through D33 in a first embodiment, where a symbol (r) indicates that the output exhibits a rising transient and a symbol (f) indicates that the output exhibits a falling transient. For the data group Data[0 . . . 31], the even-stage inverter driver D00 receives rising transients and outputs rising transients, the even-stage inverter driver D01 receives rising transients and outputs rising transients, the odd-stage inverter driver D02 receives rising transients and outputs falling transients, and the odd-stage inverter driver D03 receives falling transients and outputs rising transients. For the data group Data[32 . . . 63], the odd-stage inverter driver D10 receives rising transients and outputs falling transients, the even-stage inverter driver D11 receives falling transients and outputs falling transients, the even-stage inverter driver D12 receives falling transients and outputs falling transients, and the odd-stage inverter driver D13 receives falling transients and outputs rising transients. For data group Data[64 . . . 95], the even-stage inverter driver D20 receives rising transients and outputs rising transients, the even-stage inverter driver D21 receives rising transients and outputs rising transients, the odd-stage inverter driver D22 receives rising transients and outputs falling transients, and the odd-stage inverter driver D23 receives falling transients and outputs rising transients. For the data group Data[96 . . . 127], the odd-stage inverter driver D30 receives rising transients and outputs falling transients, the even-stage inverter driver D31 receives falling transients and outputs falling transients, the even-stage inverter driver D32 receives falling transients and outputs falling transients, and the odd-stage inverter driver D33 receives falling transients and outputs rising transients.

TABLE 1

| Internal Data line | Driver group 1 | Internal Data line | Driver group 2 | Internal Data line | Driver group 3 | Internal Data line | Driver group 4 |
|---|---|---|---|---|---|---|---|
| #0~#31 | type a (r) | #0~#31 | type a (r) | #0~#31 | type b (f) | #0~#31 | type b (r) |
| #32~#63 | type b (f) | #32~#63 | type a (f) | #32~#63 | type a (f) | #32~#63 | type b (f) |
| #64~#95 | type a (r) | #64~#95 | type a (r) | #64~#95 | type b (f) | #64~#95 | type b (r) |
| #96~#127 | type b (f) | #96~#127 | type a (f) | #96~#127 | type a (f) | #96~#127 | type b (f) |

Figure 4:
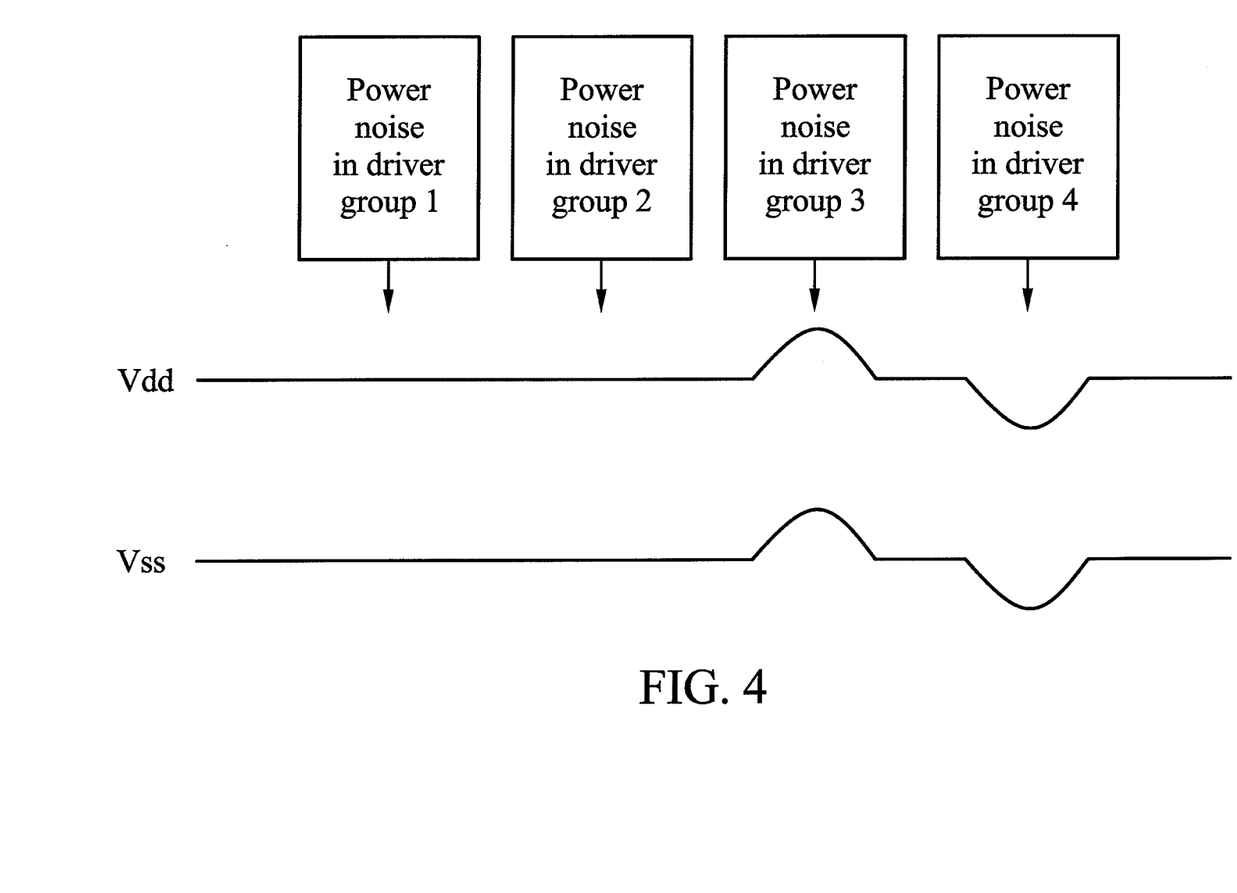
FIG. 4 illustrates power noises on power lines according to an embodiment of the invention.

Turning to FIG. 4, since the 4 data groups are connected to the power and ground lines, the net power noises on the power line vdd and the ground line vss are the combinations of all rising and falling transients of the 4 data groups Data[0 . . . 31], Data[32 . . . 63], Data[64 . . . 95], and Data[96 . . . 127] of the data buffer DATAB 12. As a result, for the driver group 1, the rising and the falling transients will be cancelled out, resulting in substantially no power noise on the power line vdd and the ground line vss; for the driver group 2, the rising and the falling transients will be cancelled out, resulting in substantially no power noise on the power line vdd and the ground line vss; for the driver group 3, all falling transients will be added up, inducing a net power noise with a positive voltage on the power line vdd and the ground line vss; for the driver group 4, all rising transients will be added up, inducing a net power noise with a negative voltage on the power line vdd and the ground line vss. In other words, with the circuit configuration in FIG. 3 and the embodiment in FIG. 4, when the data buffer DATAB 12 is in operation, the power noise only occurs at 50% of the time. In comparison to the conventional buffer circuit, the circuit arrangement in FIG. 3 results in a 50% power noise reduction.

Referring to FIG. 3 and Table 2 below, Table 2 shows output transients of inverter drivers D00 through D33 in a second embodiment, where a symbol (r) indicates that the output exhibits a rising transient and a symbol (f) indicates that the output exhibits a falling transient. For the data group Data[0 . . . 31], the even-stage inverter driver D00 receives falling transients and outputs falling transients, the even-stage inverter driver D01 receives falling transients and outputs falling transients, the odd-stage inverter driver D02 receives falling transients and outputs rising transients, and the odd-stage inverter driver D03 receives rising transients and outputs falling transients. For the data group Data[32 . . . 63], the odd-stage inverter driver D10 receives falling transients and outputs rising transients, the even-stage inverter driver D11 receives rising transients and outputs rising transients, the even-stage inverter driver D12 receives rising transients and outputs rising transients, and the odd-stage inverter driver D13 receives rising transients and outputs falling transients. For data group Data[64 . . . 95], the even-stage inverter driver D20 receives falling transients and outputs falling transients, the even-stage inverter driver D21 receives falling transients and outputs falling transients, the odd-stage inverter driver D22 receives falling transients and outputs rising transients, and the odd-stage inverter driver D23 receives rising transients and outputs falling transients. For the data group Data[96 . . . 127], the odd-stage inverter driver D30 receives falling transients and outputs rising transients, the even-stage inverter driver D31 receives rising transients and outputs rising transients, the even-stage inverter driver D32 receives rising transients and outputs rising transients, and the odd-stage inverter driver D33 receives rising transients and outputs falling transients.

vdd and the ground line vss; for the driver group 2, the rising and the falling transients will be cancelled out, resulting in substantially no power noise on the power line vdd and the ground line vss; for the driver group 3, all rising transients will be added up, inducing a net power noise with a negative voltage on the power line vdd and the ground line vss; for the driver group 4, all falling transients will be added up, inducing a net power noise with a positive voltage on the power line vdd and the ground line vss. In other words, with the circuit configuration in FIG. 3 and the embodiment in FIG. 5, when the data buffer DATAB 12 is in operation, the power noise only occurs at 50% of the time. In comparison to the conventional buffer circuit, the circuit arrangement in FIG. 3 results in a 50% power noise reduction.

Referring to FIG. 3 and Table 3 below, Table 3 shows output transients of inverter drivers D00 through D33 in a third embodiment, where a symbol (r) indicates that the output exhibits a rising transient and a symbol (f) indicates that the output exhibits a falling transient. For the data group Data[0 . . . 31], the even-stage inverter driver D00 receives rising transients and outputs rising transients, the even-stage inverter driver D01 receives rising transients and outputs rising transients, the odd-stage inverter driver D02 receives rising transients and outputs falling transients, and the odd-stage inverter driver D03 receives falling transients and outputs rising transients. For the data group Data[32 . . . 63], the odd-stage inverter driver D10 receives falling transients and outputs rising transients, the even-stage inverter driver D11 receives rising transients and outputs rising transients, the even-stage inverter driver D12 receives rising transients and outputs rising transients, and the odd-stage inverter driver D13 receives rising transients and outputs falling transients. For data group Data[64 . . . 95], the even-stage inverter driver D20 receives rising transients and outputs rising transients, the even-stage inverter driver D21 receives rising transients and outputs rising transients, the odd-stage inverter driver D22 receives rising transients and outputs falling transients, and the odd-stage inverter driver D23 receives falling tran-

TABLE 2

| Internal Data line | Driver group 1 | Internal Data line | Driver group 2 | Internal Data line | Driver group 3 | Internal Data line | Driver group 4 |
|---|---|---|---|---|---|---|---|
| #0~#31 | type a (f) | #0~#31 | type a (f) | #0~#31 | type b (r) | #0~#31 | type b (f) |
| #32~#63 | type b (r) | #32~#63 | type a (r) | #32~#63 | type a (r) | #32~#63 | type b (f) |
| #64~#95 | type a (f) | #64~#95 | type a (f) | #64~#95 | type b (r) | #64~#95 | type b (f) |
| #96~#127 | type b (r) | #96~#127 | type a (r) | #96~#127 | type a (r) | #96~#127 | type b (f) |

Figure 5:
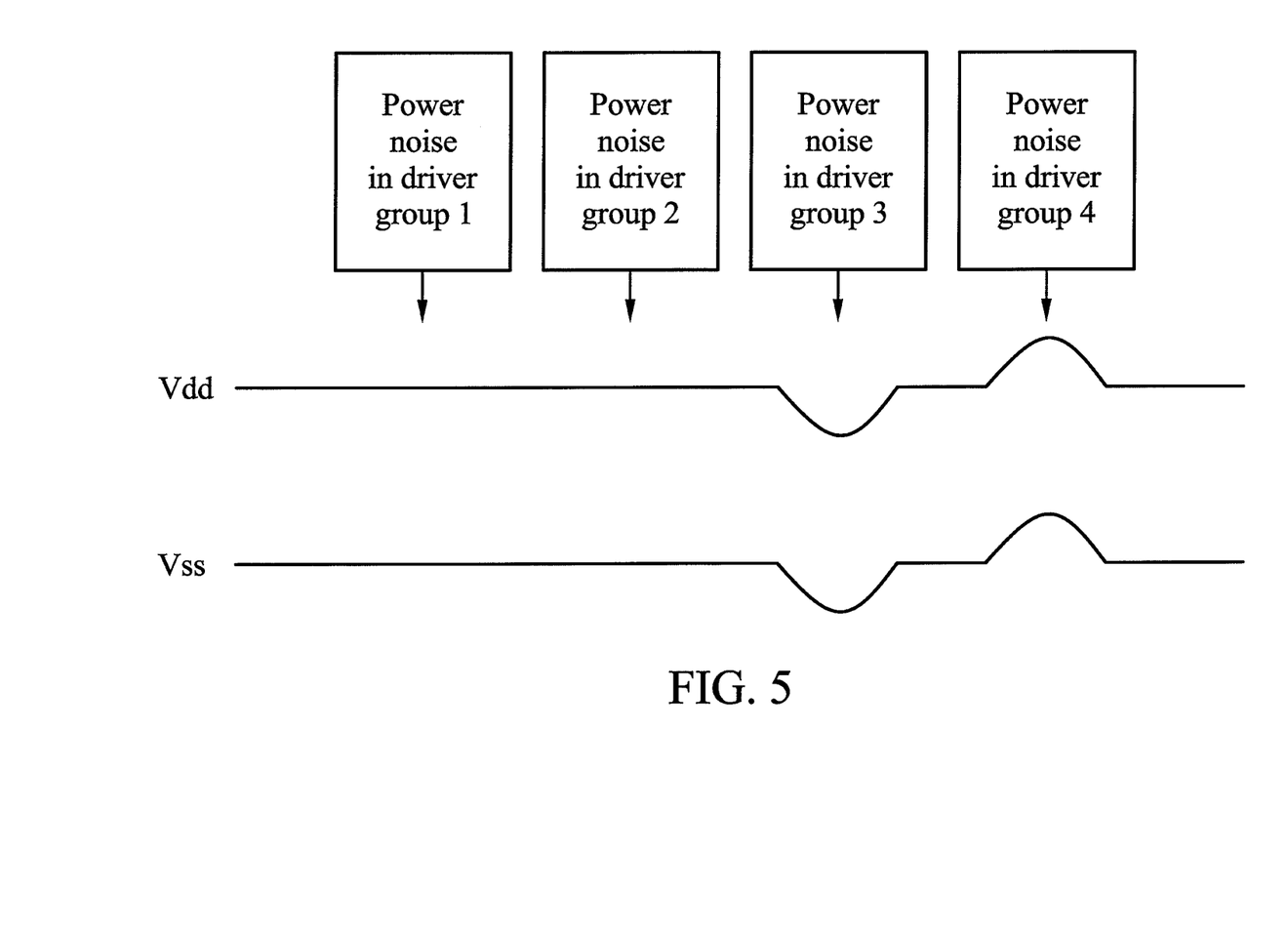
FIG. 5 illustrates power noises on power lines according to another embodiment of the invention.

Turning to FIG. 5, since the 4 data groups are connected to the power and ground lines, the net power noises on the power line vdd and the ground line vss are the combinations of all rising and falling transients of the 4 data groups Data[0 . . . 31], Data[32 . . . 63], Data[64 . . . 95], and Data[96 . . . 127] of the data buffer DATAB 12. As a result, for the driver group 1, the rising and the falling transients will be cancelled out, resulting in substantially no power noise on the power line sients and outputs rising transients. For the data group Data [96 . . . 127], the odd-stage inverter driver D30 receives falling transients and outputs rising transients, the even-stage inverter driver D31 receives rising transients and outputs rising transients, the even-stage inverter driver D32 receives rising transients and outputs rising transients, and the odd-stage inverter driver D33 receives rising transients and outputs falling transients.

TABLE 3

| Internal Data line | Driver group 1 | Internal Data line | Driver group 2 | Internal Data line | Driver group 3 | Internal Data line | Driver group 4 |
|---|---|---|---|---|---|---|---|
| #0~#31 | type a (r) | #0~#31 | type a (r) | #0~#31 | type b (f) | #0~#31 | type b (r) |
| #32~#63 | type b (r) | #32~#63 | type a (r) | #32~#63 | type a (r) | #32~#63 | type b (f) |
| #64~#95 | type a (r) | #64~#95 | type a (r) | #64~#95 | type b (f) | #64~#95 | type b (r) |
| #96~#127 | type b (r) | #96~#127 | type a (r) | #96~#127 | type a (r) | #96~#127 | type b (f) |

Figure 6:
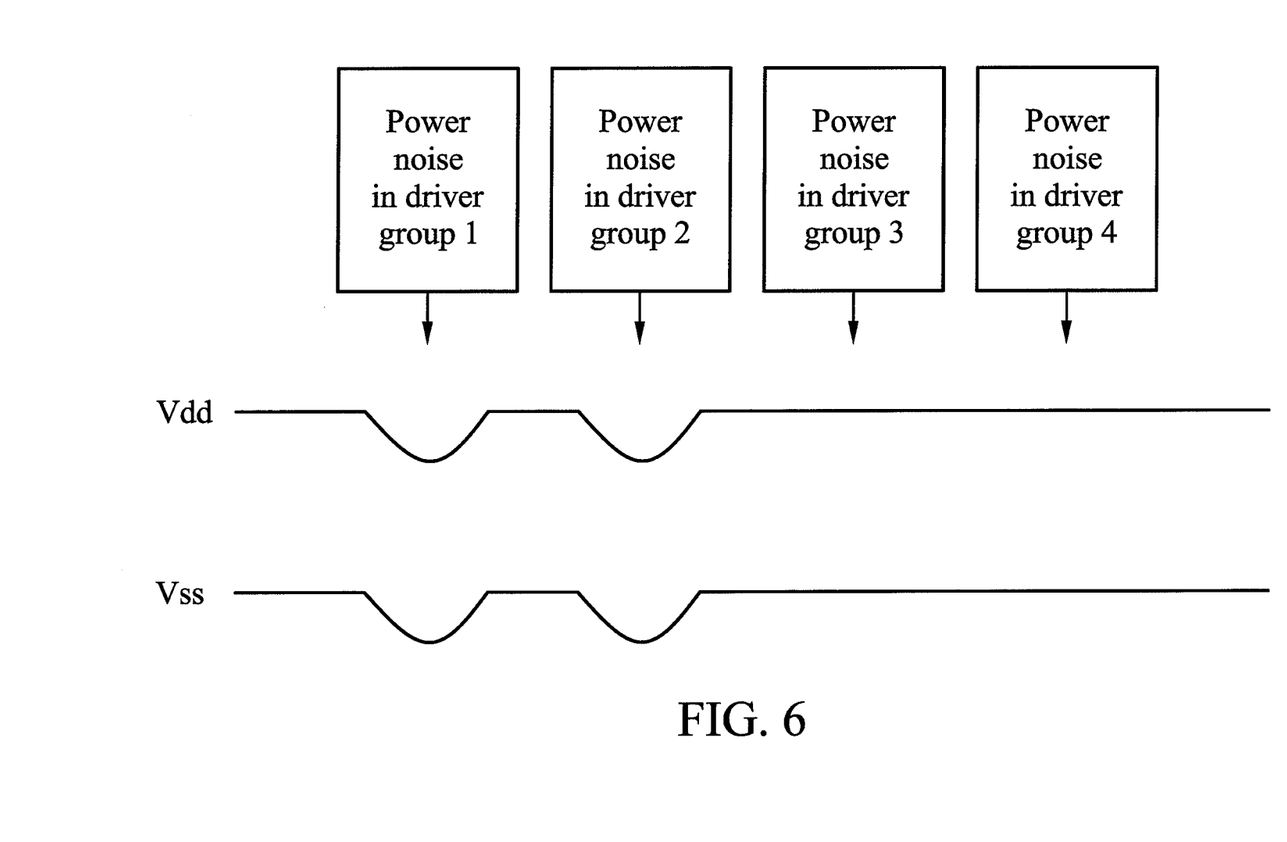
FIG. 6 illustrates power noises on power lines according to another embodiment of the invention.

Turning to FIG. 6, since the 4 data groups are connected to the power and ground lines, the net power noises on the power line vdd and the ground line vss are the combinations of all rising and falling transients of the 4 data groups Data[0 . . . 31], Data[32 . . . 63], Data[64 . . . 95], and Data[96 . . . 127] of the data buffer DATAB 12. As a result, for the driver group 1, all rising transients will be added up, inducing a net power noise with a negative voltage on the power line vdd and the ground line vss; for the driver group 2, all rising transients will be added up, inducing a net power noise with a negative voltage on the power line vdd and the ground line vss; for the driver group 3, the rising and the falling transients will be cancelled out, resulting in substantially no power noise on the power line vdd and the ground line vss; for the driver group 4, the rising and the falling transients will be cancelled out, resulting in substantially no power noise on the power line vdd and the ground line vss. In other words, with the circuit configuration in FIG. 3 and the embodiment in FIG. 6, when the data buffer DATAB 12 is in operation, the power noise only occurs only at 50% of the time. In comparison to the conventional buffer circuit, the circuit arrangement in FIG. 3 results in a 50% power noise reduction.

Referring to FIG. 3 and Table 4 below, Table 4 shows output transients of inverter drivers D00 through D33 in a fourth embodiment, where a symbol (r) indicates that the output exhibits a rising transient and a symbol (f) indicates that the output exhibits a falling transient. For the data group Data[0 . . . 31], the even-stage inverter driver D00 receives falling transients and outputs falling transients, the even-stage inverter driver D01 receives falling transients and outputs falling transients, the odd-stage inverter driver D02 receives falling transients and outputs rising transients, and the odd-stage inverter driver D03 receives rising transients and outputs falling transients. For the data group Data[32 . . . 63], the odd-stage inverter driver D10 receives rising transients and outputs falling transients, the even-stage inverter driver D11 receives falling transients and outputs falling transients, the even-stage inverter driver D12 receives falling transients and outputs falling transients, and the odd-stage inverter driver D13 receives falling transients and outputs rising transients. For data group Data[64 . . . 95], the even-stage inverter driver D20 receives falling transients and outputs falling transients, the even-stage inverter driver D21 receives falling transients and outputs falling transients, the odd-stage inverter driver D22 receives falling transients and outputs rising transients, and the odd-stage inverter driver D23 receives rising transients and outputs falling transients. For the data group Data[96 . . . 127], the odd-stage inverter driver D30 receives rising transients and outputs falling transients, the even-stage inverter driver D31 receives falling transients and outputs falling transients, the even-stage inverter driver D32 receives falling transients and outputs falling transients, and the odd-stage inverter driver D33 receives falling transients and outputs rising transients.

TABLE 4

| Internal Data line | Driver group 1 | Internal Data line | Driver group 2 | Internal Data line | Driver group 3 | Internal Data line | Driver group 4 |
|---|---|---|---|---|---|---|---|
| #0~#31 | type a (f) | #0~#31 | type a (f) | #0~#31 | type b (r) | #0~#31 | type b (f) |
| #32~#63 | type b (f) | #32~#63 | type a (f) | #32~#63 | type a (f) | #32~#63 | type b (r) |
| #64~#95 | type a (f) | #64~#95 | type a (f) | #64~#95 | type b (r) | #64~#95 | type b (f) |
| #96~#127 | type b (f) | #96~#127 | type a (f) | #96~#127 | type a (f) | #96~#127 | type b (r) |

Figure 7:
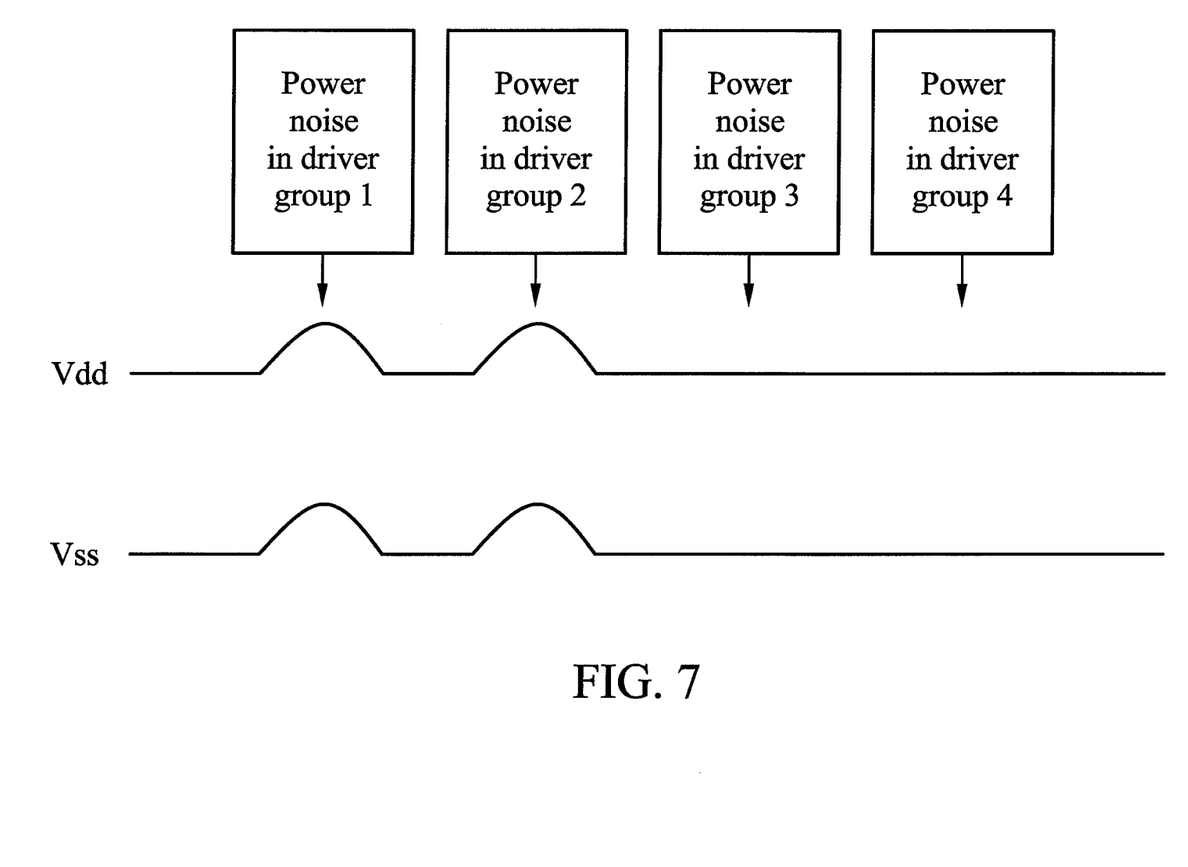
FIG. 7 illustrates power noises on power lines according to another embodiment of the invention.

Turning to FIG. 7, since the 4 data groups are connected to the power and ground lines, the net power noises on the power line vdd and the ground line vss are the combinations of all rising and falling transients of the 4 data groups Data[0 . . . 31], Data[32 . . . 63], Data[64 . . . 95], and Data[96 . . . 127] of the data buffer DATAB 12. As a result, for the driver group 1, all falling transients will be added up, inducing a net power noise with a positive voltage on the power line vdd and the ground line vss; for the driver group 2, all falling transients will be added up, inducing a net power noise with a positive voltage on the power line vdd and the ground line vss; for the driver group 3, the rising and the falling transients will be cancelled out, resulting in substantially no power noise on the power line vdd and the ground line vss; for the driver group 4, the rising and the falling transients will be cancelled out, resulting in substantially no power noise on the power line vdd and the ground line vss. In other words, with the circuit configuration in FIG. 3 and the embodiment in FIG. 6, when the data buffer DATAB 12 is in operation, the power noise only occurs only at 50% of the time. In comparison to the conventional buffer circuit, the circuit arrangement in FIG. 3 results in a 50% power noise reduction.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The term "or" used herein is intended to mean an inclusive "or" rather than an exclusive "or." That is, unless specified otherwise, or clear from the context, the phrase "X employs A or B" is intended to mean any of the natural inclusive permutations. In addition, the articles "a" and "an" as used in this application and the appended claims should generally be construed to mean "one or more" unless specified otherwise or clear from the context to be directed to a singular form.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit, comprising:
   a power line;
   a ground line;
   first and second data lines, coupled between the power line and the ground line, wherein each data line comprises 4 driver groups;
   wherein for the first data line, the first driver group contains an even-stage inverter driver, the second driver group contains the even-stage inverter driver, the third driver group contains an odd-stage inverter driver, and the fourth driver group contains the odd-stage inverter driver;
   for the second data line, the first driver group contains the odd-stage inverter driver, the second driver group contains the even-stage inverter driver, the third driver group contains the even-stage inverter driver, and the fourth driver group contains the odd-stage inverter driver;
   the even-stage inverter driver comprises an even number of inverters; and
   the odd-stage inverter driver comprises an odd number of inverters.

2. The driving circuit of claim 1, wherein for each data line, the first driver group is swap in place with the third driver group.

3. The driving circuit of claim 1, wherein for each data line, the second driver group is swap in place with the fourth driver group.

4. The driving circuit of claim 1, wherein for each data line, the first driver group is swap in place with the second driver group, and the third driver group is swap in place with the fourth driver group.

5. The driving circuit of claim 1, wherein the first and second data lines are configured to drive memory data of a memory cell array.

6. The driving circuit of claim 1, further comprising:
   third and fourth data lines, coupled between the power line and the ground line, wherein the third data line is configured to be identical as the first data line, and the fourth data line is configured to be identical as the second data line.

7. A memory device, comprising:
   a power line;
   a ground line;
   a memory circuit, coupled between the power line and the ground line, comprising a driving circuit and a memory cell array;
   wherein the diving circuit comprises first and second data lines, coupled between the power line and the ground line, driving memory data to and from the memory cell array, each data line comprises 4 driver groups;
   for the first data line, the first driver group contains an even-stage inverter driver, the second driver group contains the even-stage inverter driver, the third driver group contains an odd-stage inverter driver, and the fourth driver group contains the odd-stage inverter driver;
   for the second data line, the first driver group contains the odd-stage inverter driver, the second driver group contains the even-stage inverter driver, the third driver group contains the even-stage inverter driver, and the fourth driver group contains the odd-stage inverter driver;
   the even-stage inverter driver comprises an even number of inverters; and
   the odd-stage inverter driver comprises an odd number of inverters.

8. The memory device of claim 7, wherein for each data line, the first driver group is swap in place with the third driver group.

9. The driving circuit of claim 1, wherein for each data line, the second driver group is swap in place with the fourth driver group.

10. The memory device of claim 7, wherein for each data line, the first driver group is swap in place with the second driver group, and the third driver group is swap in place with the fourth driver group.

11. The memory device of claim 7, wherein the first and second data lines are configured to drive memory data of a memory cell array.

12. The memory device of claim 7, further comprising:
    third and fourth data lines, coupled between the power line and the ground line, wherein the third data line is configured to be identical as the first data line, and the fourth data line is configured to be identical as the second data line.

* * * * *